United States Patent
Weyers

(10) Patent No.: US 11,430,781 B2
(45) Date of Patent: Aug. 30, 2022

(54) SEMICONDUCTOR DIE

(71) Applicant: Infineon Technologies Dresden GmbH & Co. KG, Dresden (DE)

(72) Inventor: Joachim Weyers, Hoehenkirchen (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/750,958

(22) Filed: Jan. 23, 2020

(65) Prior Publication Data
US 2020/0243505 A1 Jul. 30, 2020

(30) Foreign Application Priority Data
Jan. 24, 2019 (EP) .................................... 19153518

(51) Int. Cl.
*H01L 27/02* (2006.01)
*H01L 23/522* (2006.01)

(52) U.S. Cl.
CPC ...... *H01L 27/0255* (2013.01); *H01L 23/5226* (2013.01); *H01L 27/0292* (2013.01); *H01L 27/0296* (2013.01)

(58) Field of Classification Search
None
See application file for complete search history.

(56) References Cited

U.S. PATENT DOCUMENTS

| | | | |
|---|---|---|---|
| 2008/0290367 A1* | 11/2008 | Su | H01L 29/7811 257/173 |
| 2012/0326207 A1* | 12/2012 | Yoshimochi | H01L 21/763 257/139 |
| 2013/0092976 A1* | 4/2013 | Hsieh | H01L 27/0255 257/133 |
| 2014/0183639 A1 | 7/2014 | Ma et al. | |
| 2017/0271319 A1 | 9/2017 | Schmitt et al. | |
| 2018/0090479 A1* | 3/2018 | Weyers | H01L 29/7811 |
| 2018/0301553 A1 | 10/2018 | Weyers et al. | |

* cited by examiner

*Primary Examiner* — Steven M Christopher
(74) *Attorney, Agent, or Firm* — Murphy, Bilak & Homiller, PLLC

(57) ABSTRACT

In an embodiment, a semiconductor die includes a transistor device that has a cell field and an edge termination region, a source pad arranged on the cell field, a gate pad laterally arranged laterally adjacent the cell field and in the edge termination region, a shielding region laterally surrounding the cell field, the shielding region including a non-depletable doped. The polysilicon ESD protection diode is arranged laterally between the gate pad and the source pad and vertically above at least a portion of the shielding region, and includes at least two separate sections that are electrically coupled in parallel between the gate pad and the source pad. The sections are laterally spaced apart by a gap situated at a corner of the gate pad.

13 Claims, 11 Drawing Sheets

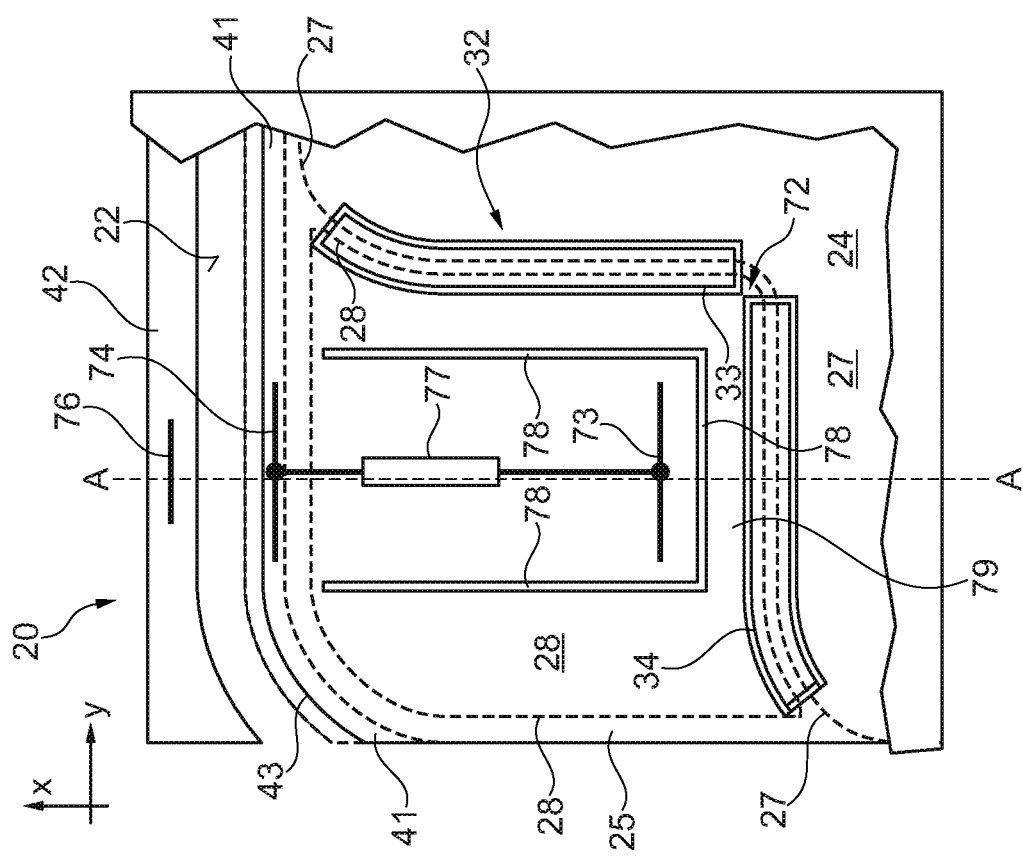
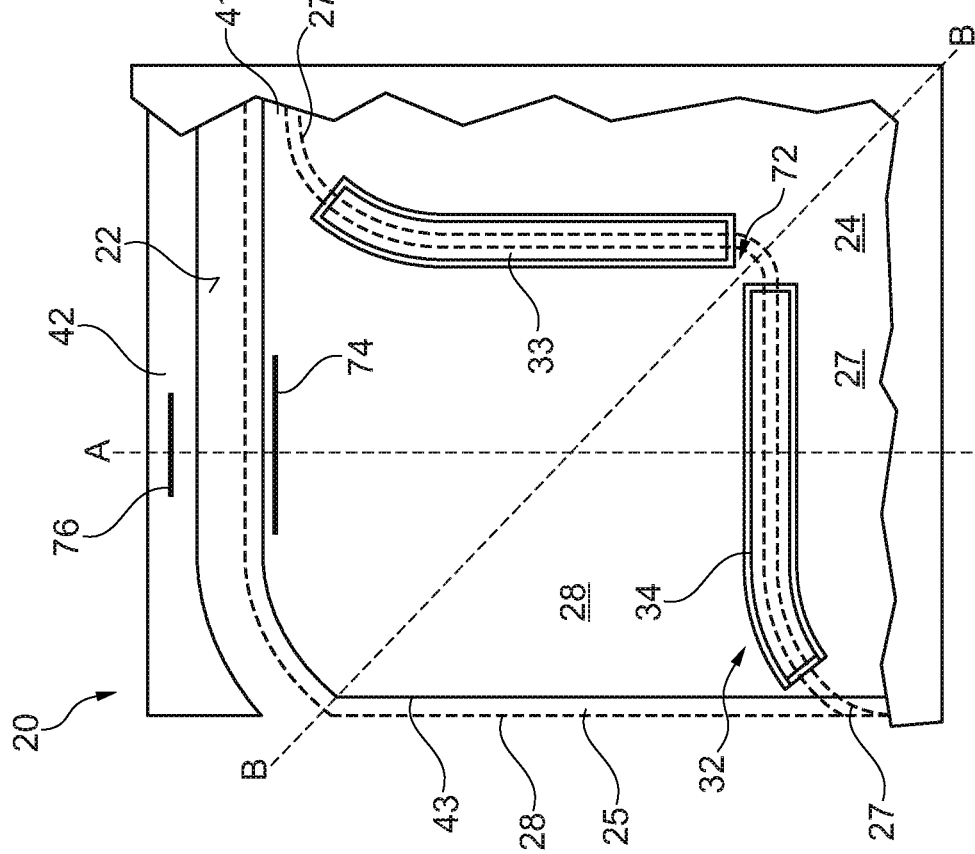

SEMICONDUCTOR DIE

BACKGROUND

Semiconductor devices may be subjected to various effects which can lead to damage of the semiconductor device. For example, semiconductor devices may be subjected to electrostatic discharge (ESD) events. US 2018/0090479 A1 discloses a semiconductor device comprising a transistor arrangement with a diode structure coupled between a gate structure and a source structure of the transistor arrangement. The diode structure is intended to provide protection for the transistor arrangement against ESD events. However, further improvements to the protection provided for semiconductor devices against ESD events are desirable.

SUMMARY

In an embodiment, a semiconductor die comprises a transistor device that comprises a cell field and an edge termination region, a source pad arranged on the cell field, a gate pad arranged laterally adjacent the cell field and in the edge termination region, a shielding region laterally surrounding the cell field, the shielding region comprising a non-depletable doped region. The polysilicon ESD protection diode is arranged laterally between the gate pad and the source pad and vertically above at least a portion of the shielding region. The polysilicon ESD protection diode comprises at least two separate sections that are electrically coupled in parallel between the gate pad and the source pad. The sections are laterally spaced apart by a gap situated at a corner of the gate pad.

In an embodiment, a semiconductor die comprises a transistor device that comprises a cell field and an edge termination region, a source pad arranged on the cell field, a gate pad laterally arranged laterally adjacent the cell field and in the edge termination region, a shielding region laterally surrounding the cell field, the shielding region comprising a non-depletable doped region. The polysilicon ESD protection diode is arranged laterally between the gate pad and the source pad and vertically above at least a portion of the shielding region. The polysilicon ESD protection diode extends along two adjoining sides of the gate pad and comprises a concave portion extending around a corner of the gate pad formed between the two adjoining sides and a convex portion that extends away from the gate pad at each end of the polysilicon ESD protection diode.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 2a and 2b illustrates respective enlarged views of the gate pad of the semiconductor die of FIG. 1 according to two embodiments.

FIG. 3 illustrates a cross-sectional view along the line A-A of FIG. 2a.

FIG. 4 illustrates a cross-sectional view along the line B-B in FIG. 2a.

DETAILED DESCRIPTION

Figure 1:
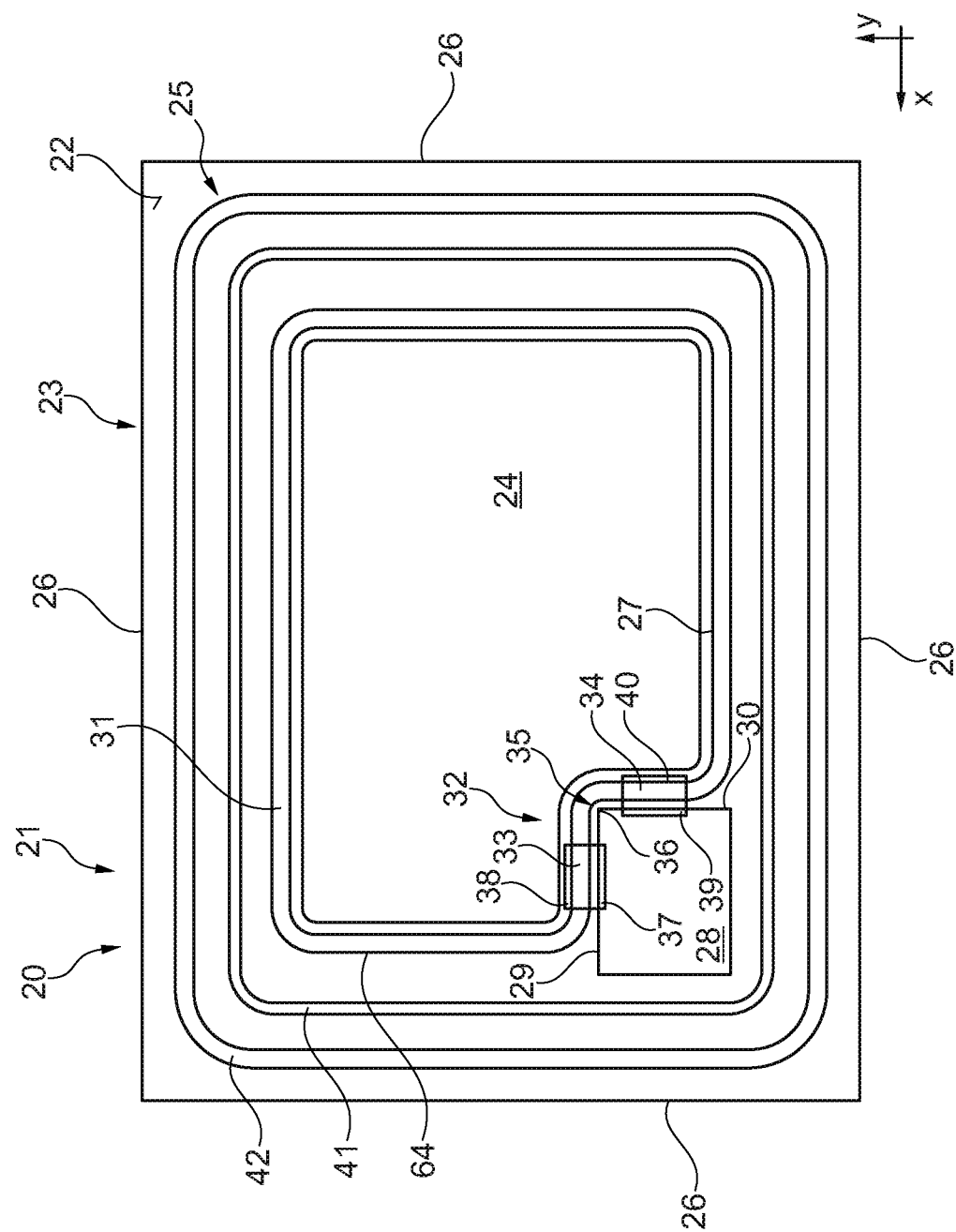
FIG. 1 illustrates a top view of a semiconductor die according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In an embodiment, a semiconductor die is provided which includes a superjunction transistor device and an integrated diode for protecting the superjunction transistor device against electrostatic discharge (ESD). An example of a superjunction transistor device is a CoolMOS® device.

Superjunction devices typically have a predefined area which is typically kept small in order to reduce the active area and Rds(on) for the device. This, however, restricts the amount of space available for including additional devices such as an ESD protection diode in the same semiconductor die as the superjunction transistor device. If the ESD protection diode is integrated into the area around the gate pad, the space available for the ESD protection diode is also restricted since the area of the gate pad is typically kept as small as possible so as not to increase the overall size of the die.

The semiconductor die may include other types of transistor device in place of the superjunction transistor device. In some embodiments, a semiconductor die is provided that includes a vertical transistor device, that is a transistor device with a vertical drift path, and an integrated diode for protecting the vertical transistor device against electrostatic discharge. In some embodiments, a semiconductor die is provided which includes an IGBT (Insulated Gate Bipolar Transistor) device and an integrated diode for protecting the IGBT transistor device against electrostatic discharge (ESD).

In some embodiments, the ESD protection device is provided in the form of a polysilicon ESD protection device which includes two sections that are spaced apart from one another and extend substantially perpendicularly to one another in a top view of the semiconductor die. These sections may be arranged laterally between the gate pad and the source pad of the transistor device such that the gap between the sections is arranged at a corner of the gate pad. Each section may comprise multiple diodes, in particular, ESD protection diodes and the multiple ESD protection diodes and the two sections are electrically coupled in parallel between the gate pad and the source pad and consequently between the gate and source electrodes of the transistor device.

The provision of multiple separate sections positioned between the gate pad and the source pad is used to avoid a concave section in the ESD protection diode in plan view, typically at the corner or corners of the gate pad, in which current crowding and locally increased electric fields could otherwise occur which can, in some ESD events, lead to an increased risk of destroying the ESD protection diode. At the same time, the total width of the ESD protection diode is reduced by only a small amount over an arrangement in which the two sections are joined by a concave section around the corner to provide a single ESD protection diode. This is useful as the width of the ESD protection diode is a parameter in determining the protection rating provided by the ESD protection diode.

In some embodiments, the width of the ESD protection diode is increased by the provision of a convex extension at the distal end of one or two sections of the ESD protection diodes. The convex extension extends away from the gate pad and has a curved form which may be aligned or substantially concentric with an outer contour of the source pad.

In an alternative embodiment, a single continuous ESD protection diode is provided that includes at least one concave section that extends around a corner of the gate pad and a convex section at one end or a convex section at each end in order to increase the width of the ESD protection diode. Thus the ESD HBM (Human Body Model) capability of the semiconductor die is increased without requiring an increase in the area of the semiconductor die or without restricting the area of the semiconductor die used for the active device, i.e. transistor device such as a the superjunction transistor device or a IGBT device, by occupying this area with the ESD protection diode.

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device, the term "drain" encompasses not only a drain of a MOSFET device or of a superjunction device but also a collector of an insulator gate bipolar transistor (IGBT) device, and the term "gate" encompasses not only a gate of a MOSFET device or of a superjunction device but also a gate of an insulator gate bipolar transistor (IGBT) device.

FIG. 1 illustrates a top view of a semiconductor die 20 having a semiconductor chip layout 21. The semiconductor die 20 includes a semiconductor body having a first major surface 22. The semiconductor body may be formed of silicon. The semiconductor die 20 and the semiconductor chip layout 21 include a transistor device 23 which includes a cell field 24 and an edge termination region 25. In some embodiments, the transistor device 23 is a vertical transistor device with a vertical drift path. In some embodiments, the transistor device 23 is a superjunction device. In other embodiments, the transistor device 23 is an IGBT device. The superjunction device and the IGBT device are examples of vertical transistor devices.

The edge termination region 25 laterally surrounds the cell field 24 and is positioned at the periphery of the first major surface 22 adjacent sidewalls 26 of the semiconductor die 20 which define the lateral extent of the first major surface 22. The semiconductor die 20 includes a source pad 27 which is arranged on the cell field 24 and comprises metal and a gate pad 28 which is positioned laterally adjacent the cell field 24 and in the edge termination region 25. The gate pad 28 comprises metal. The outer contour of the source pad 27 is positioned laterally adjacent and spaced apart from the two adjoining sides 29, 30 of the gate pad 28. For a vertical transistor device, such as a superjunction transistor device, the source pad 27 and gate pad 28 are positioned on the first major surface 22 of the semiconductor die 20 and a drain pad is positioned on the opposing major surface of the semiconductor die 20.

A passivation layer such as a polyimide may be arranged on the gate pad 28 and source pad 27 and include openings above the gate pad 28 and the source pad 27, respectively, to provide an exposed portion which provides a contact area. This contact area can be called a pad, in which case the source pad 27 is called a source metal or source metal layer and the gate pad 28 is called a gate metal or gate metal layer. The source pad 27 and gate pad 28 may include two or more sublayers of differing composition and the metal may be an alloy.

In the embodiment illustrated in FIG. 1, the gate pad 28 is positioned towards a corner of the first major surface 22 and has a substantially square or rectangular form such that the cell field 24 is positioned laterally adjacent to adjoining sides 29, 30 of the gate pad 28.

The semiconductor die 20 further comprises a shielding region 31 which extends from the first surface 22 into the semiconductor body and which laterally surrounds the cell field 24. The shielding region 31 has the form of an uninterrupted and continuous ring that has a lateral form that is substantially aligned with the outer contour of the source pad 27. Both the shielding region 31 and the cell field 24 are positioned laterally adjacent the two sides 29, 30 of the gate pad 28. The shielding region 31 has a lateral extent such that it extends under the periphery of the source pad 27 and is positioned vertically underneath the outer contour of the source pad 27 and such that it extends laterally into the edge termination region 25.

In some embodiments, the shielding region 31 includes a non-depletable doped region 62 (not illustrated in FIGS. 1 and 2).

In some embodiments, the shielding region 31 includes a non-depletable doped region 62 and further includes a depletable doped region (not illustrated in FIGS. 1 and 2a-2b) which are laterally contiguous to one another such that a boundary 64 is formed between the non-depletable doped region and the depletable doped region. The position of the depletable doped region 63 as well as the boundary 64 and the non-depletable doped region 62 can be seen in the cross-sectional views of FIGS. 3 to 6.

The semiconductor die 20 further comprises an integrated ESD (Electrostatic Discharge) protection diode in the form of a polysilicon ESD diode 32. The polysilicon ESD protection diode 32 is positioned laterally between the gate pad 28 and the source pad 27 and is positioned vertically above at least a portion of the shielding region 31. In embodiments in which the shielding region comprises a laterally contiguous non-depletable doped region 62 and depletable doped region 63 with a boundary 64 therebetween, the polysilicon ESD protection diode 31 may be arranged vertically above the boundary 64 between the non-depletable doped region 62 and the depletable doped region 63 of the shielding region 31. The polysilicon ESD protection diode 32 extends under the gate pad 28 and under the source pad 27 and is electrically coupled between the gate pad 28 and source pad 27.

In the embodiment illustrated in FIG. 1, the polysilicon ESD protection diode 32 comprises two separate sections 33, 34 that are electrically coupled in parallel between the gate pad 28 and source pad 27 and positioned between the cell field 24 and the gate pad 28. Each of the sections 33, 34 is substantially rectangular with the long dimension providing the width of the diode. The sections 33, 34 are substantially coplanar and extend substantially perpendicularly to one another in plan view. The sections 33, 34 are laterally spaced apart from one another by a gap 35 which is situated at a corner 36 of the gate pad 28 and, in particular, adjacent the corner 36 of the gate pad 28 which is formed by the intersection of the two adjoining sides 29, 30.

The first section 33 of the polysilicon ESD protection diode 32 is positioned at the first side 29 of the gate pad 28 such that it has a first portion 37 which is positioned underneath and electrically coupled to the gate pad 28 and a second opposing portion 38 which is positioned under and electrically coupled with the source pad 27. The second section 34 of the polysilicon ESD protection diode 32 is positioned at the second side 30 of the gate pad 28. Similarly, the second section 34 of the polysilicon ESD protection diode 32 includes a first portion 39 which is positioned under and electrically coupled with the gate pad 28 and a second opposing portion 40 which is positioned under and electrically coupled with the source pad 27.

The use of the two separate sections 33, 34 positioned between the gate pad 28 and the source pad 27 may be used to avoid a concave section, in plan view, in the ESD protection diode at the corner 36 of the gate pad 28, in which current crowding and locally increased electric fields could otherwise occur which could in some ESD events lead to an increased risk of destroying the ESD protection diode. The gap 35 between the two sections 33, 34 may have a distance of less than 80 μm, for example less than 20 μm. The minimum distance between the two sections 33, 34 provided by the gap 35 may be 5 μm or 10 μm.

The polysilicon ESD protection diode 32 is arranged on the shielding region 31 and has a lateral area, in particular length, which is smaller than the lateral area of the shielding region 31. Consequently, the shielding region 31 extends further into the edge termination region 25 and into the cell field 24 than the polysilicon ESD diode 32. This arrangement provides electrical shielding of the polysilicon ESD protection diode 32 by the shielding region 31 against electrostatic and electricdynamic potentials in the drift region 51 and compensation region 52 for a superjunction device, below the gate pad 28 of the semiconductor die 20.

Also illustrated in the top view of the semiconductor die 20 of FIG. 1 are a gate runner 41, which laterally surrounds the cell field 24 and the gate pad 28, and a drain ring 42. In the embodiment illustrated in FIG. 1, the gate runner 41 has a continuous ring-shape and comprises metal. The gate runner 41 is electrically coupled to the gates of the cell field 24 and the gate pad 28 by a gate polysilicon layer which cannot be seen the top view of FIG. 1. The drain ring 42 is positioned at the periphery of the first major surface 22 and laterally surrounds the gate runner 41. The drain ring 42 is electrically coupled to a drain region of the superjunction transistor device 23 which is positioned at the rear surface of the semiconductor die 20 by a vertical conductive path which extends between the drain ring 42 and the rear surface of the semiconductor die 20. A conductive pad, for example a metal pad, positioned on the rear surface of the semiconductor die 20 provides a drain pad for the superjunction transistor device 23.

FIGS. 2a and 2b illustrate enlarged views of the gate pad 28 of FIG. 1 according to two embodiments, and illustrate the position of the gate pad 28, the gate runner 41, the drain ring 42 and the source pad 27. The position of the shielding region 31 and two sections 33, 34 of the polysilicon ESD diode 32 is also illustrated in FIGS. 2a and 2b. The lateral extent of the gate pad 28, the gate runner 41 and the source pad 27 is indicated in FIGS. 2a and 2b with dashed lines.

FIGS. 2a and 2b also illustrate the arrangement of a gate polysilicon layer 43 which electrically connects gate electrodes in the cell field 24 to the gate pad 28 and the gate runner 41. The gate polysilicon layer 43 is positioned on the cell field 24 and extends under the gate pad 28 and underneath the gate runner 41. The gate polysilicon layer 43 may be positioned under the drain ring 42 and in some embodiments extends under only the portion of the width of the gate runner 41, in particular the portion of the width of the gate runner 41 that is adjacent the gate pad 28 and the cell field 24. The lateral extent of the gate polysilicon layer 43 is indicated in FIGS. 2a and 2b with solid lines.

In some embodiments, such as that illustrated in FIG. 2a, the gate polysilicon layer 43 extends continuously and uninterruptedly under the gate pad 28. The gate polysilicon layer 43 includes openings in which the polysilicon ESD protection diode 32 is positioned so that the gate polysilicon layer 43 is laterally spaced apart from the polysilicon ESD protection diode 32.

In some embodiments, such as that illustrated in FIG. 2b, the gate polysilicon layer 43 includes a gap 78 that is positioned under the gate pad 28. In these embodiments, the gate polysilicon layer 43 is locally interrupted under the gate pad 28 by the gap 78. In some embodiments, the gap 78 is U-shaped and positioned adjacent the adjoining sides 29, 30 of the gate pad 28.

In the embodiment of FIG. 2a, the gate runner 41 extends into and is integral with the gate pad 28. A single conductive via 74 may be used to electrically couple the gate polysilicon layer 43 to the gate pad 28 and the integrated gate runner 41.

In the embodiment of FIG. 2b, the gate runner 41 is laterally spaced apart from the gate pad 28. The gate polysilicon layer 43 is electrically connected to the gate runner 41 by a first conductive via 74 and to the gate pad 28 by a second conductive via 73. The gap 78 in the gate polysilicon layer 43 is positioned between the first conductive via 73 and the polysilicon ESD protective diode 32.

In some embodiments, a gate resistor 77 may be coupled between the first and second conductive vias 74, 73 and, therefore, between the gate pad 28 and the gate runner 41 as the gate pad 28 and the gate runner 41 are laterally spaced apart from one another.

In some embodiments, such as those illustrated in FIGS. 2a and 2b, the gate polysilicon layer 43 includes a gate connection 72 that extends between the two sections 33, 34 of the polysilicon ESD diode 32 such that it is positioned in the gap 35 at the corner 36 of the gate pad 28 and is spaced laterally apart from the two sections 33, 34 of the polysilicon ESD diode 32. This polysilicon gate connection 72 may be used to provide a more direct connection of the gate electrodes of the cell field 24 to the gate pad 28 without an intervening connection to the gate runner 41. The lateral distance between the gate polysilicon layer including the gate connection 72 and the sections 33, 34 of the polysilicon ESD protection diode may be small, for example in the region of 1 µm to 2 µm.

In the embodiment illustrated in FIG. 2b, a strip portion 79 of the gate polysilicon layer 43 is positioned between the gap 78 and the sections 33, 34 of the ESD protection diode 32 that is coupled to the gate connection 72 and to gate electrodes in the cell field 24.

Figure 3:
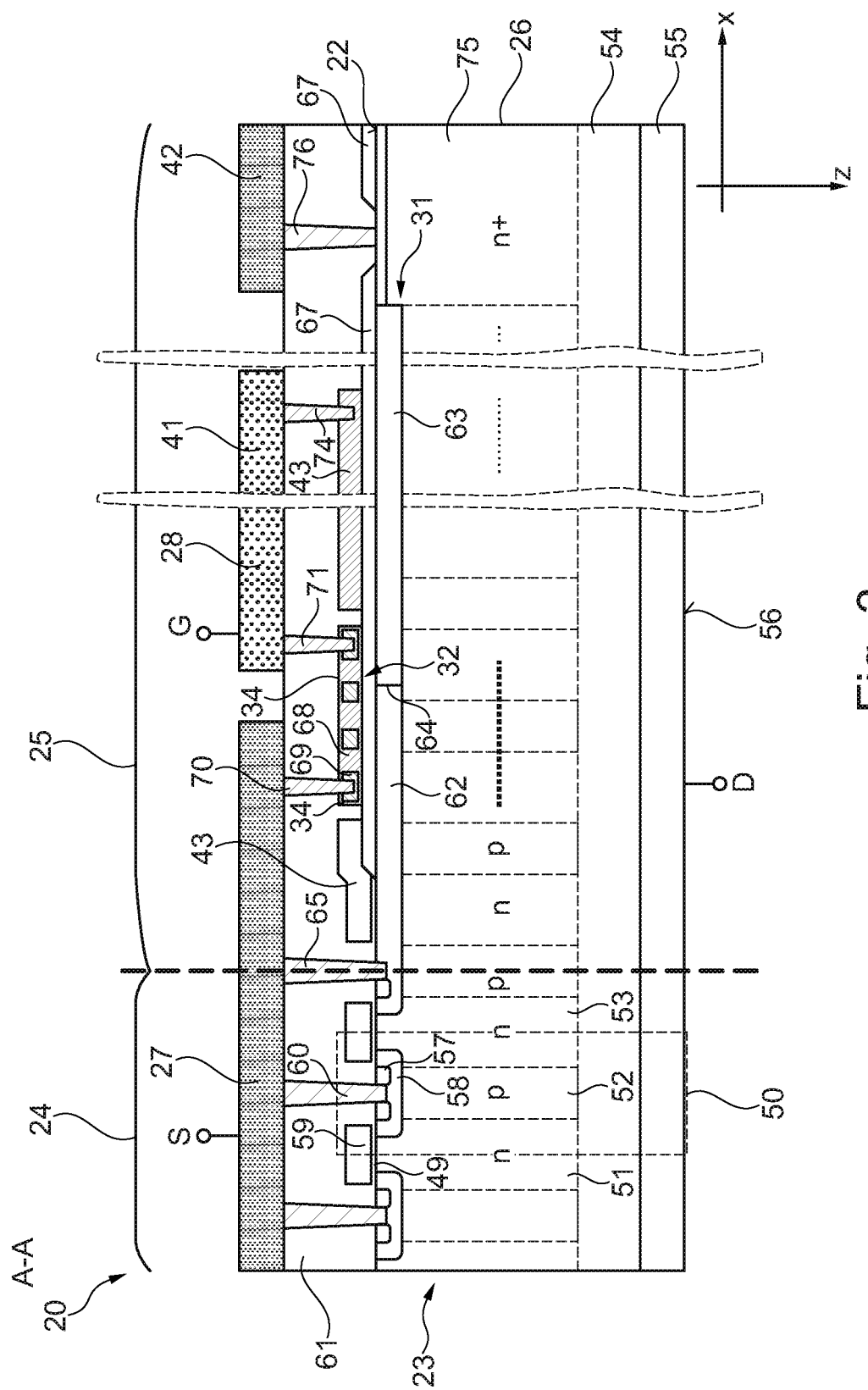

FIG. 3 illustrates a cross-sectional view along line A-A shown in FIG. 2a and illustrates a portion of the cell field 24 and edge termination region 25 of the semiconductor die 20.

As can be seen in the cross-sectional view of FIG. 3, the semiconductor die 20 includes a plurality of transistor cells 50 which together provide the transistor device 23. In the embodiments illustrated in FIGS. 3 to 6, the transistor device 23 is a superjunction transistor device 23. The superjunction transistor device 23 includes a plurality of doped columns of opposing conductivity extending into the body of the semiconductor die 20 substantially perpendicularly to the first major surface 22. The columns of opposing conductivity are arranged laterally alternately, for example a first column 51 comprising a first conductivity type, is arranged laterally adjacent a second column 52 comprising a second conductivity type that is in turn arranged laterally adjacent a third column 53 including the first conductivity type and so on. The first conductivity type may be n-type and the second conductivity type may be p-type. The columns stretch from the first major surface 22 to an optional field stop region 54 which is arranged on a drain region 55 which forms the rear surface 56 of the semiconductor die 20. In some embodiments, the columns of one conductivity type, for example p-type, may be formed in a semiconductor body of the first conductivity type, for example n-type. The semiconductor body may include a plurality of epitaxial layers sequentially formed on a substrate, such as a silicon single crystal substrate, in order to build up the columnar structure.

The first and third columns 51, 53 of the first conductivity type provide the drift region and the second columns 52 of the second conductivity type provide the compensation regions of the superjunction transistor cell 50.

At the first major surface 22, each transistor cell 50 includes a doped source region 57 of the first conductivity type which is arranged in a body zone 58 of the second conductivity type. Gate electrodes 59 are arranged on the first major surface 22 and extend between body zones 58 of adjacent transistor cells 50. The gate electrodes 59 are electrically insulated from the semiconductor body of the semiconductor die 20 by a gate oxide 49. The doped source regions 57 are electrically coupled to the source pad 27 by conductive vias 60 which extend through a first insulating layer 61 arranged on the first major surface 22 of the semiconductor die 20 and the gate electrodes 59.

As can be seen in the cross-sectional views, the shielding region 31 comprises a non-depletable doped region 62 and a depletable doped region 63 which are contiguous to one another such that a boundary 64 is formed therebetween. The non-depletable doped region 62 and a depletable doped region 63 are doped with the second conductivity type. The non-depletable doped region 62 may comprise a maximum doping concentration of $8*10^{15}$ cm$^{-3}$ to $1*10^{17}$ cm$^{-3}$. The depletable doped region 63 may comprise a maximum doping concentration of $5*10^{11}$ cm$^{-3}$ to $8*10^{15}$ cm$^{-3}$.

The non-depletable doped region 62 of the shielding region 31 is positioned laterally adjacent the cell field 24 and the depletable doped region 63 of the shield region 31 extends into the edge termination region 25. The shielding region 31 extends into the semiconductor body from the first major surface 22 and is laterally positioned such that the non-depletable doped region 62 extends into the peripheral edge of the cell field 24 where it is electrically coupled to the source pad 27 by a conductive via 65. The remainder of the non-depletable doped region, the boundary 64 and the depletable region 63 is positioned in the edge termination region 25. The depletable doped region 63 extends in the direction of the side face 26 of the semiconductor die 20.

A second insulating layer 67 is arranged on the shielding region 31 and may include an oxide. The polysilicon ESD protection diode 32 and the gate polysilicon layer 43 are arranged on the second insulating layer 67. The first insulating layer 61 is positioned on the polysilicon ESD protection diode 32 and the gate polysilicon layer 43. The second insulating layer 67 may be referred to as a field oxide. The non-depletable doped region 62 of the shielding region 31 comprises a doping concentration that is non-depletable by voltages applied to the superjunction transistor device 23 during a blocking mode of the superjunction transistor device 23.

The shielding region 31 may be used to promote the removal of residual minority charge carriers during a switching operation, for example commutating or turning off the superjunction transistor device 23. This may be used to reduce the switching time and decrease a maximum current density during the removal of the minority carriers.

The lateral area of the polysilicon ESD protection diode 32 is less than that of the shielding region 31. As the polysilicon ESD protection diode 32 is arranged vertically above, the shielding region 31 can be used to reduce a leakage current or back gate effect of the polysilicon ESD protection diode 32 during operation. By shielding the polysilicon ESD diode 32 from electric potentials of the underlying semiconductor substrate, in particular the drain potential, the formation of channels or turn-on of a parasitic transistor structure is avoided and may be used to reduce power consumption and degradation of the polysilicon ESD protection diode 32.

The shielding region 31 may have different forms. In some embodiments, the shielding region 31 includes the non-depletable doped region 62 only. In some embodiments, the non-depletable region 62 of the shielding region 31 may have a lateral extent such that an outermost edge, that is an outermost edge with respect to a direction extending from the cell field 24 in the direction of the edge termination region 25 and the side face 26 of the semiconductor die 20, of the non-depletable region 62 is positioned vertically under the polysilicon ESD protection diode 32. The innermost edge may is positioned vertically under the source pad 27.

In some embodiments, in which the shielding region 31 includes the non-depletable doped region 62 only, the non-depletable region 62 of the shielding region 31 has a lateral extent such that the outermost edge of the non-depletable region 62 extends further into the edge termination region 25 than the polysilicon ESD protection diode 32 and may be positioned vertically under the gate pad 28.

In some embodiments, such as that illustrated in FIG. 3, the shielding region 31 further comprises a depletable doped region 63 that forms a boundary 64 with the non-depletable region 62 and the non-depletable doped region 62 of the shielding region 31 is positioned laterally adjacent the cell field 24, the depletable doped region 63 of the shielding region 31 extends into the edge termination region 25 and the polysilicon ESD protection diode 32 is positioned above the boundary 64. In these embodiments, a portion of the ESD protection diode 32 is positioned vertically above the non-depletable region 62 and vertically above the depletable region 63.

The second section 34 of the polysilicon ESD protection diode 32 can be seen in the cross-sectional view of FIG. 3. The first section 33 has the same structure. The polysilicon ESD protection diode 32 is positioned on the second insulating layer 67 such that it is positioned above the boundary 64 between the non-depletable doped region 62 and the depletable doped region 63 of the shielding region 31 and is positioned in the edge termination region 25. The polysilicon ESD protection diode 32 is also laterally positioned, that is positioned in an x-y plane defined by the x and y directions indicated in FIGS. 2a-2b, so that opposing sides are positioned under the source pad 27 and the gate pad 28.

The ESD protection diode 32 includes a plurality of doped regions 68, 69 of opposing conductivity which are positioned laterally adjacent one another. The regions 68, 69 of opposing conductivity are arranged alternately and laterally adjacent one another to form a plurality of vertical pn junctions, the pn junctions extending substantially concentrically to the shielding region 31, whereby concentrically describes the relative lateral arrangement in the x-y plane of two or more shapes, i.e. the regions 68, 69 of opposing conductivity and the shielding region 31, that have a common centre. The form in a top view of the ESD protection diode 32, therefore, follows the form of the shielding region 31 in the top view so that the lateral position of the ESD protection diode 32 and the shielding region 31 remains substantially the same along the width of the ESD protection diode 32.

The doped regions 68, 69 comprise polysilicon have the form of stripes extending into the plane of the drawing. For example, stripes 68 of the first conductivity type and stripes 69 of the second conductivity type may be alternately formed to produce a plurality of vertical PN junctions having a width extending into the plane of the drawing. The doped regions 68, 69 provide a plurality of PN diodes. The doped regions 68, 69 and the PN junctions may have a lateral form that is conformal to the lateral shape of the shielding region 31.

The polysilicon ESD protection diode 32 is covered by the first insulating layer 61 and is electrically coupled to the source pad 27 by a conductive via 70 and to the gate pad 28 by a conductive via 71. The n-doped regions 68 may have a doping concentration of 1e17 $cm^{-3}$ to 1e19 $cm^{-3}$ and the p-doped regions 69 may have a doping concentration of 1e19 $cm^{-3}$ to 1e20 $cm^{-3}$.

The gate polysilicon layer 43 is positioned on the second insulation layer 67 and electrically couples the gate electrodes 59 of the transistor cells 50 to the gate pad 28 and the gate runner 41. The gate polysilicon layer 43 is positioned on the second insulation layer 67 and is covered by the first insulation layer 61. The gate polysilicon layer is coupled to the gate pad 28 by one or more conductive vias 73 and to the gate runner 41 by one or more conductive vias 74.

In the cross-sectional view A-A of FIG. 3, the gate runner 41 is integral with the gate pad 28 and the gate polysilicon layer 43 is uninterrupted in the portion positioned under the gate pad 28 as can be seen in the top view of FIG. 2a.

Also illustrated in the cross-sectional view of FIG. 3 is a highly doped region 75 of the first conductivity type which extends from the first major surface 22 to the optional field stop region 54 and which is electrically coupled to the drain region 55 at the rear of the semiconductor die 20. The highly doped region 75 is electrically coupled to the drain ring 42 by a conductive via 76 which extends through the first insulation layer 61.

Figure 4:
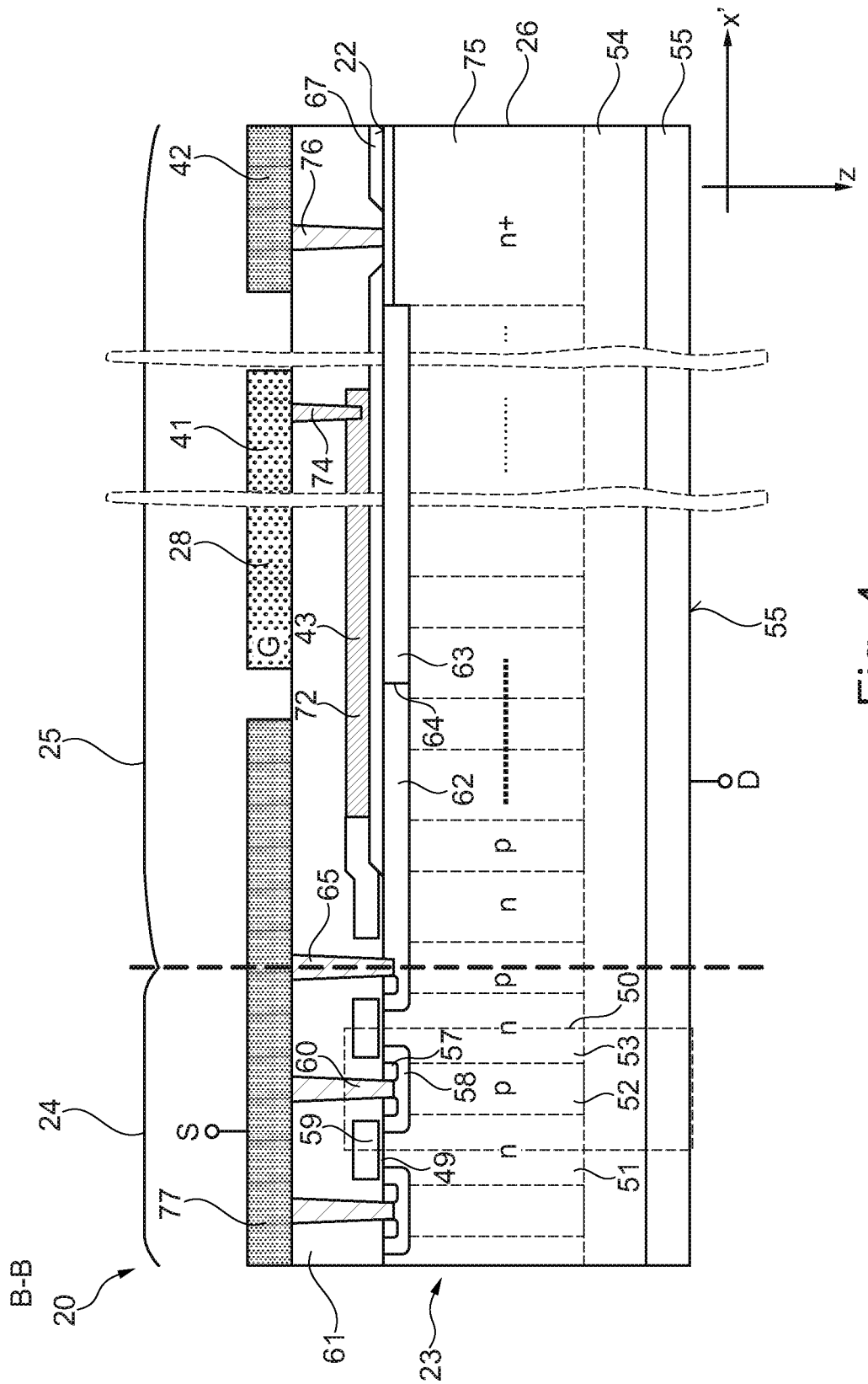

FIG. 4 illustrates a cross-sectional view along the line B-B shown in FIG. 2a. In the cross-sectional view of FIG. 4, it can be seen how the gate connection 72 of the gate polysilicon layer 43 extends on the second insulating layer 67 uninterruptedly from the cell field 24 over the boundary 64 between the non-depletable doped region 62 and the depletable doped region 63 of the shielding region 31 and under the gate pad 28 and the gate runner 41 that is integral with the gate pad 28. In this portion of the semiconductor chip layout 21, the gate polysilicon layer 43 provides a polysilicon gate connection 72 which extends through the gap 35 between the two separate sections 33, 34 of the poly silicon ESD protection diode 32. The gate connection 72 is laterally spaced apart from the two separate sections 33, 34 of the polysilicon ESD protection diode 32. The polysilicon gate connection 72 provides a conductive path between some of the gate electrodes 59 in the cell field 24 and the gate pad 28 without the gate runner 41. The polysilicon gate connection 72 is connected to the gate pad 28 by the conductive via 73.

The gate polysilicon layer 43 is also uninterrupted under the gate pad 28 in the view of FIG. 4 as illustrated in the top view of FIG. 2a.

Figure 5:
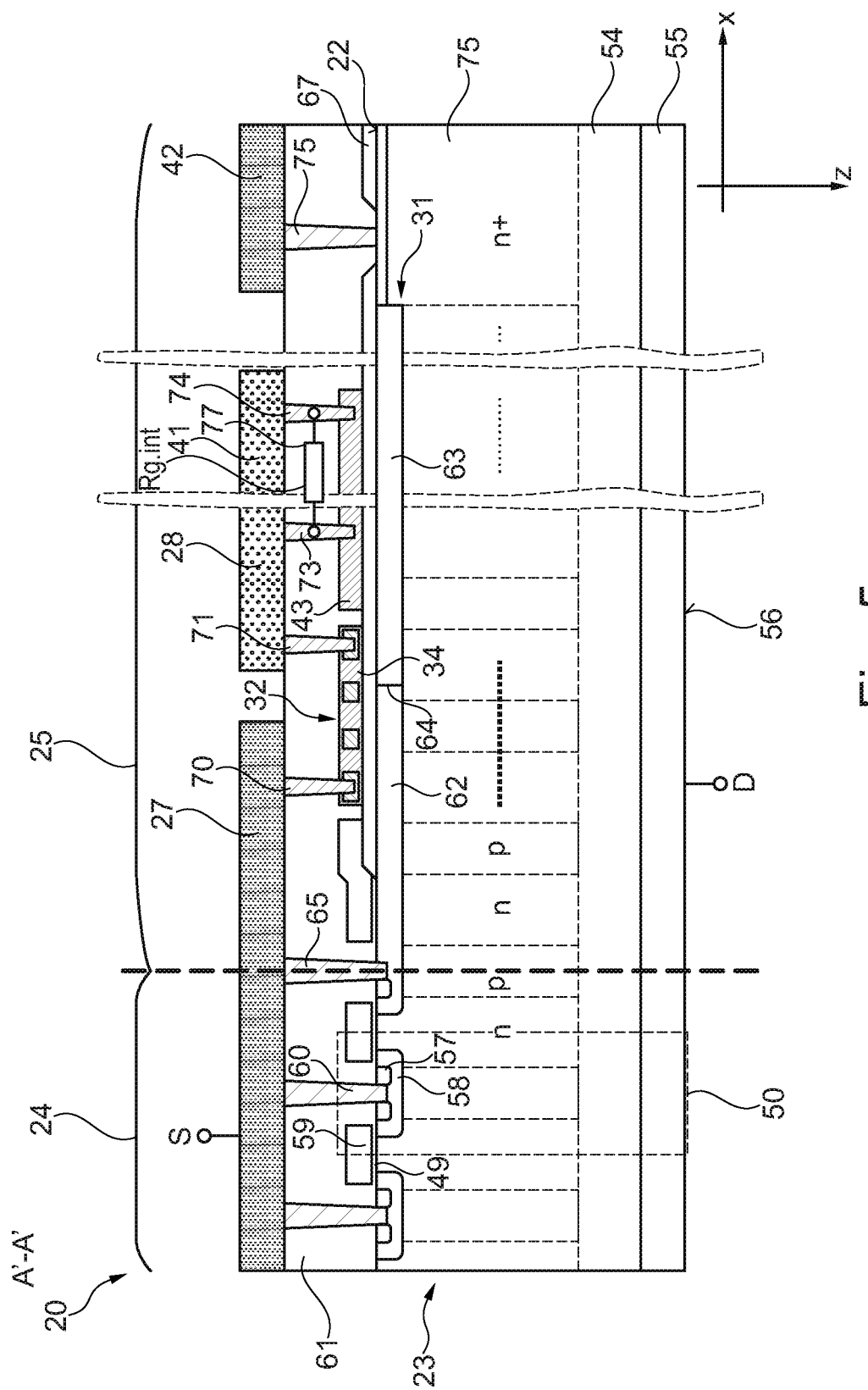
FIG. 5 illustrates a cross-sectional view A'-A' corresponding to the line A-A in FIG. 2a and illustrates a gate resistor.

FIG. 5 illustrates a cross-sectional view A'-A' corresponding to the line A-A of FIG. 2a and illustrates an arrangement for forming an integrated gate resistor 77 in embodiments in which the gate pad 28 is spaced apart from the gate runner 41. The gate resistor 77 is formed from a portion of the gate polysilicon layer 43 and is positioned under, and electrically coupled between, the gate pad 28 and the gate runner 41. As in the embodiment illustrated in FIG. 2b, the gate pad 28 and gate runner 41 are laterally spaced apart from one another and the gate polysilicon layer extends under and between the gate pad 28 and the gate runner 41. The gate polysilicon layer 43 is electrically coupled to the gate runner 41 by a first conductive via 74 and to the gate pad 28 by second conductive via 73. In the embodiment illustrated in FIG. 5, the gate polysilicon layer 43 extends continuously and without gaps in the region under the gate pad 28.

Figure 6:
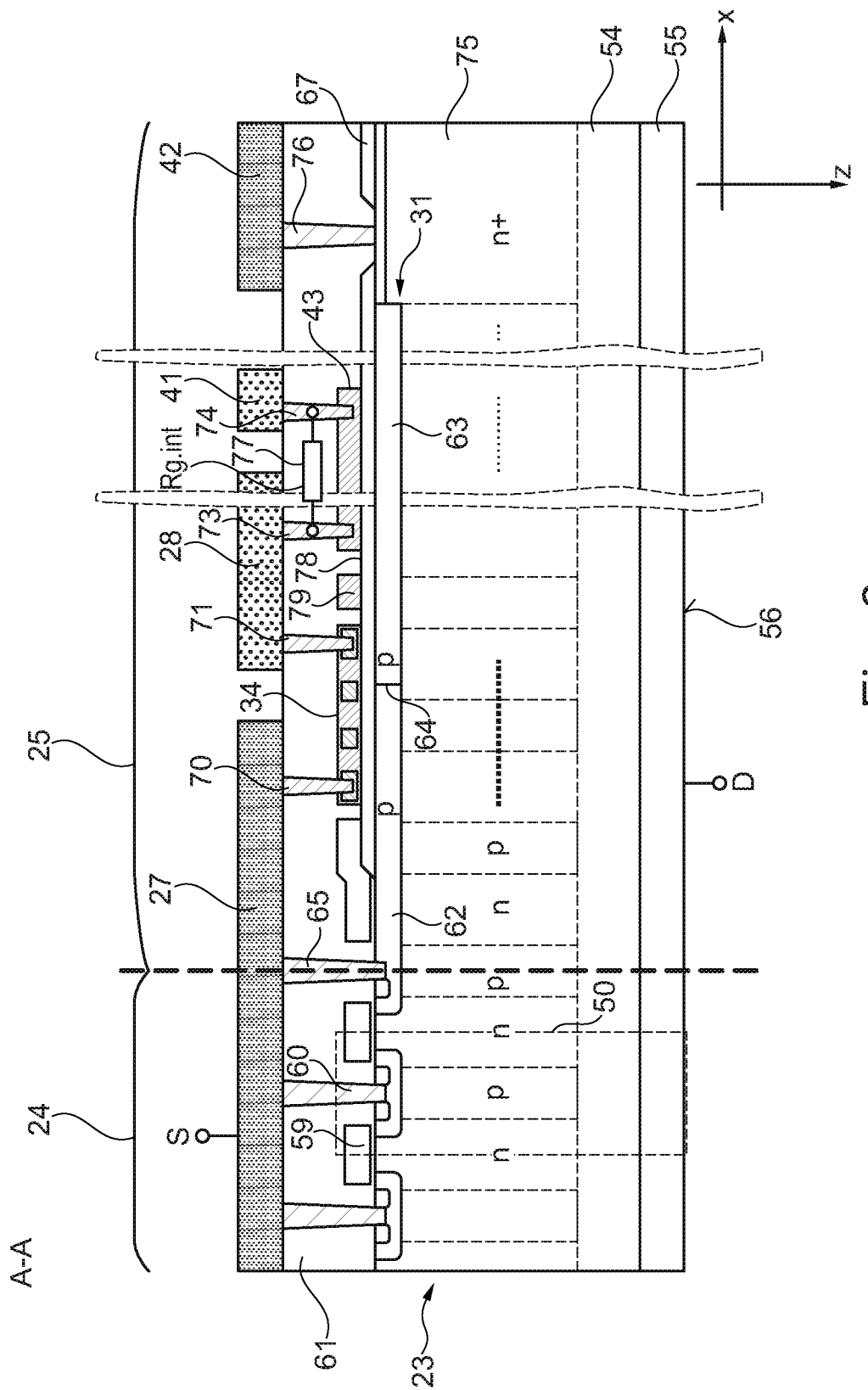
FIG. 6 illustrates a cross-sectional view along the line A-A of FIG. 2b and illustrates a gate resistor according to another embodiment.

FIG. 6 illustrates a cross-sectional view corresponding to the line A-A of FIG. 2b. In the embodiment illustrated in FIG. 6, the gate polysilicon layer 43 comprises an interruption in the form of a gap 78 which is positioned under the gate pad 28 between the edge of the polysilicon layer 43 that faces towards the second section 34 of the polysilicon ESD protection diode 32 and the conductive via 73 which electrically couples the gate polysilicon layer 72 to the gate pad 28. This interruption may be used to form the gate resistor 77. This interruption 78 has a lateral U-shape as can be seen in the enlarged top views of FIG. 2b and is positioned adjacent both the first section 33 and the second section 34 of the polysilicon ESD protection diode 32. However the interruption or gap 78 may have other shapes apart from a U-shape. For example, the gap 78 may be an arbitrary shape. The value of the resistance of the gate resistor 77 may be adjusted by adjusting the width of the interruption 78.

FIG. 6 also illustrates the integrated gate resistor 77. The gate resistor 77 is electrically coupled between the gate pad 28 and the gate runner 41 which, as can be seen from the top views of FIG. 2b, are laterally spaced apart from one another. The integrated gate resistor 77 may be provided by a portion of the gate polysilicon layer 43 that is positioned under the gate pad 28 and is electrically connected to the gate pad by the conductive via 73 and to the gate runner 74 by the conductive via 74. The value of the resistance of the gate resistor 77 may be adjusted by adjusting the width of the interruption 78. Furthermore, a portion 79 of the gate polysilicon structure 43 that is positioned between the gap 78 and the polysilicon ESD protection diode 32 may be used as a conductive path between some of the gate electrodes 59 in the cell field 24 and the gate pad 28.

Figure 7:
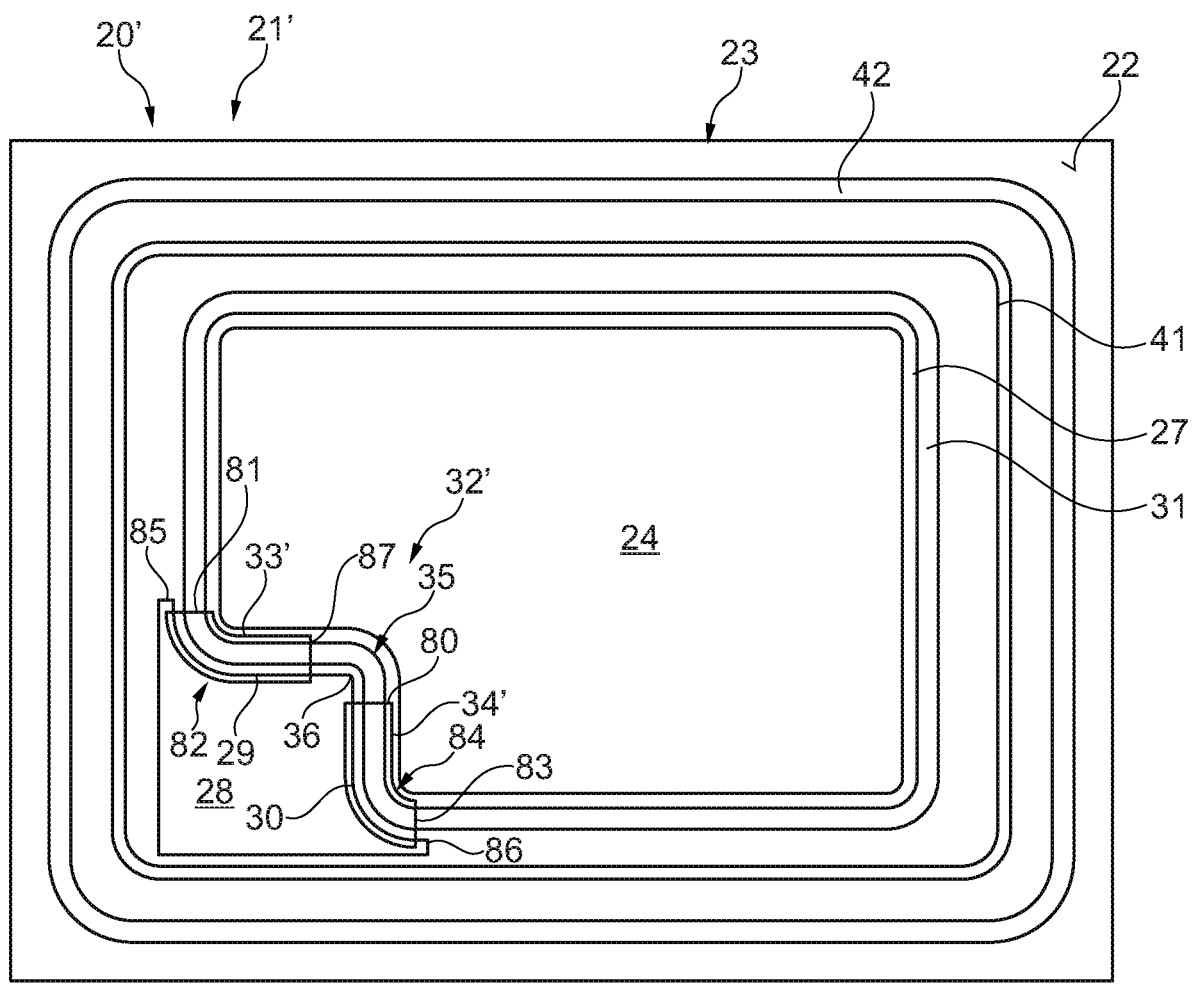
FIG. 7 illustrates a top view of a semiconductor die according to an embodiment.

FIG. 7 illustrates a top view of a semiconductor die 20' with a chip layout 21' which differs from that illustrated in FIGS. 1 to 6 in the form of the polysilicon ESD protection diode 32'. The polysilicon ESD protection diode 32 includes two sections 33' 34' which are arranged on two substantially orthogonal sides of the gate pad 28 as in the embodiments illustrated in FIGS. 1 to 6. Again as illustrated in the embodiments illustrated in FIGS. 1 to 6, each of the sections 33', 34' partially vertically overlaps with the shielding region 31 and the source metal pad 27 and with the gate pad 28.

The first section 33' has a first end 87 which faces towards the corner 36 of the gate pad 28 and which is spaced at a distance from the first end 80 of the second section 34' which also extends faces towards the corner 36. The first section 33 includes a second end 81 which opposes the first end 78 which includes a curved extension 82. The curved extension 82 has a convex form with respect to the gate pad 28 and has a curved form which is conformal to the curved form of the shielding region 31 and curved outer contour of the source pad 27. Similarly, the second section 34' has a second end 83 which opposes the first end 80 and which extends into a curved extension 84 which is convex with respect to the gate pad 28 and which is conformal with the curved shape of the shielding layer 31 and the outer contour of the source pad 27.

In this embodiment, gate pad 28 has a form which is adapted to the curved extensions 82, 84 of the polysilicon ESD protection diode 32'. Each of the adjoining sides 29, 30 of the gate pad 28 includes a curved form 85, 86 at the end of the side 29, 30 that faces away from the corner 36. This form enables the gate pad 28 to be positioned above the curved extensions 82, 84 of the first and second sections 33' 34', respectively. In this way, a vertical (for example, the z direction in the orientation indicated in the drawings) connection can be formed along the entire width of the first and second sections 33', 34' by an elongate conductive via positioned between vertically overlapping portions of the first section 33' and the gate pad 28 and of the second section 34' and the gate pad 28. The conductive vias, for example the conductive via 71 illustrated in the cross-sectional views of FIGS. 3, 5 and 6, may also have a lateral form which conforms to the lateral form of the first and second sections 33', 34' of the polysilicon ESD protection diode 32 and the outer contour of the gate pad 28 and include curved extensions. The conductive vias, for example the conductive via 70 illustrated in the cross-sectional views of FIGS. 3, 5 and 6, may also have a lateral form (for example in the x-y plane) which conforms to the lateral form of the first and second sections 33', 34' of the polysilicon ESD protection diode 32 and the outer contour of the source pad 27 and include curved extensions.

Figure 8:
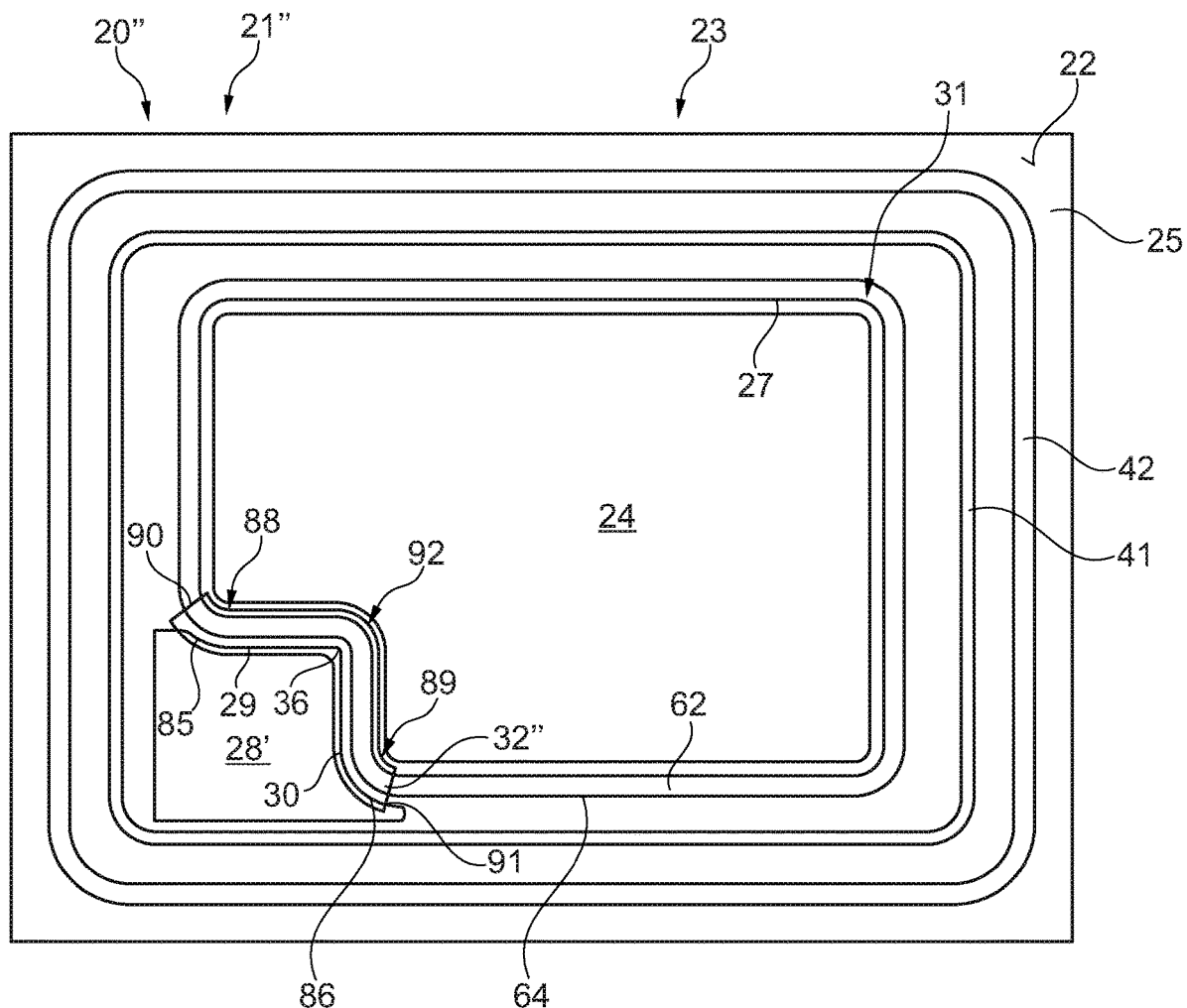
FIG. 8 illustrates a top view of a semiconductor die according to an embodiment.

FIG. 8 illustrates a semiconductor die 20" having a semiconductor chip layout 21" which differs from that illustrated in FIGS. 1 to 7 in the lateral form of the poly silicon ESD protection diode 32".

The semiconductor die 20" includes a superjunction transistor device 23 comprising the cell field 24, the edge termination region 25, the gate pad 28' arranged laterally adjacent the cell field 24 and in the edge termination region 25, the shielding region 31 laterally surrounding the two adjoining sides 29, 30 of the gate pad 28' that face towards the cell field 24. The shielding region 31 includes a non-depletable doped region 62 which extends into the cell field 24. As in the embodiment of FIGS. 1 to 7, the polysilicon ESD protection diode 32" is arranged vertically above at least a portion of the shielding region 31 and laterally between the gate pad 28' and the source pad 27.

In some embodiments, such as that illustrated in FIG. 8, a polysilicon ESD protection diode 32" with a single section is provided that extends uninterruptedly and along the two adjoining sides 29, 30 of the gate pad 28' which face towards the cell field 24. The polysilicon ESD protection diode 32" also includes a concave portion 92 which extends around the corner 36 of the gate pad 28' formed between the two adjoining sides 29 and 30 and a convex portion 88, 89 at each opposing end 90, 91 of the polysilicon ESD protection diode 32" which extends away from the gate pad 28'. The polysilicon ESD protection diode 32", therefore, includes the extensions 82, 83 illustrated in FIG. 7 at opposing ends of a single section polysilicon ESD protection diode 32". The gate pad 28' includes the curved portions 85, 86 which overlap with the curved portions 88, 89 of the polysilicon ESD protection diode 32" as in the embodiment illustrated in FIG. 7.

The extensions 81, 82 (for example of the embodiment illustrated in FIG. 7) and convex portions 88, 89 (for example of the embodiment illustrated in FIG. 8) of the polysilicon ESD protection diode 32', 32", respectively, may be used to increase the width of the ESD polysilicon diode 32', 32", respectively, and its ESD HBM protection rating.

The concave portion 85 has a radius of curvature R1 which is less than the radius of curvature R2 of the convex portions 88, 89 providing the extensions 81, 82 so that R1<R2. In some embodiments, R2>4R1.

Figure 9:
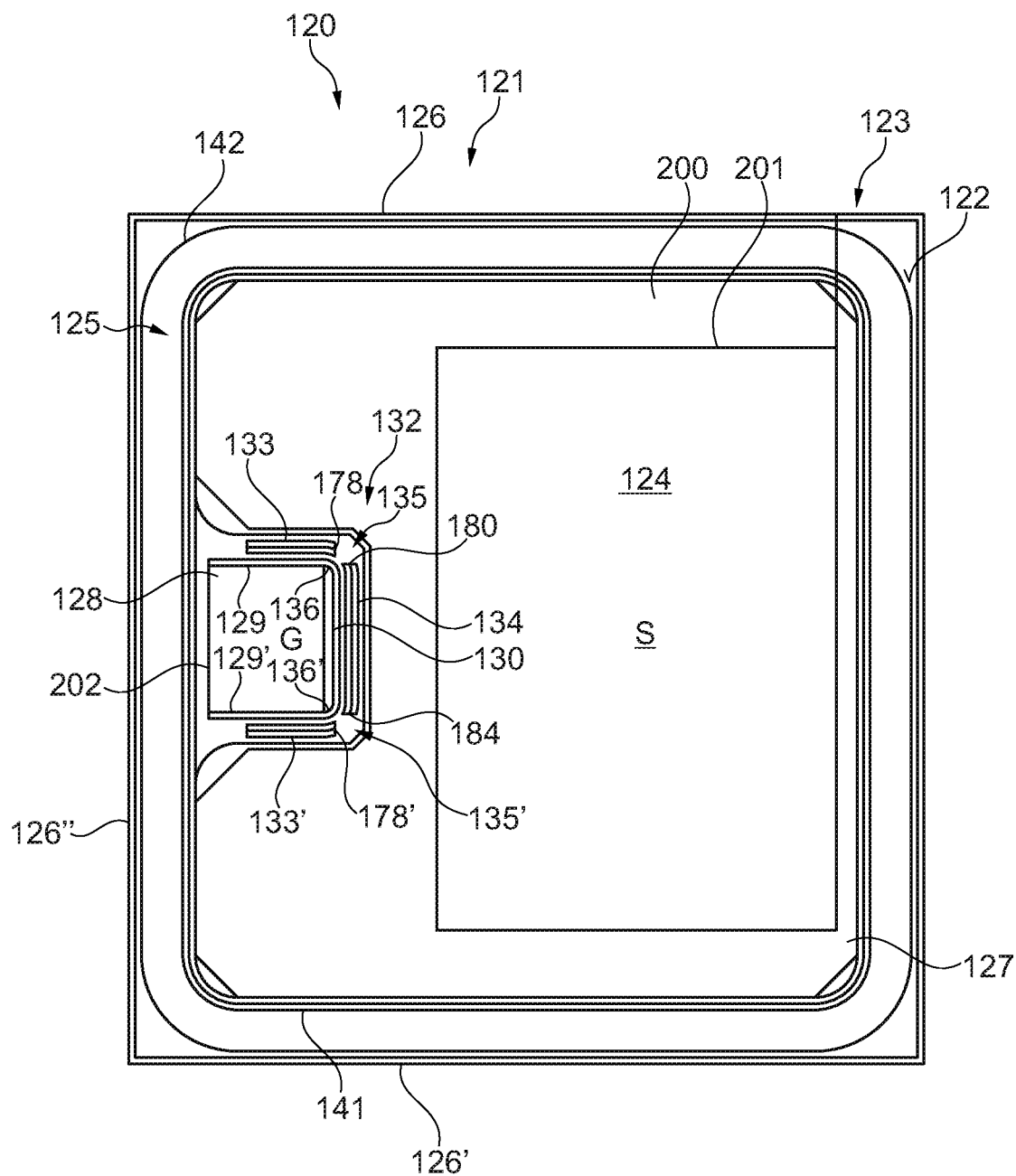
FIG. 9 illustrates a top view of a semiconductor die according to an embodiment.
Figure 10:
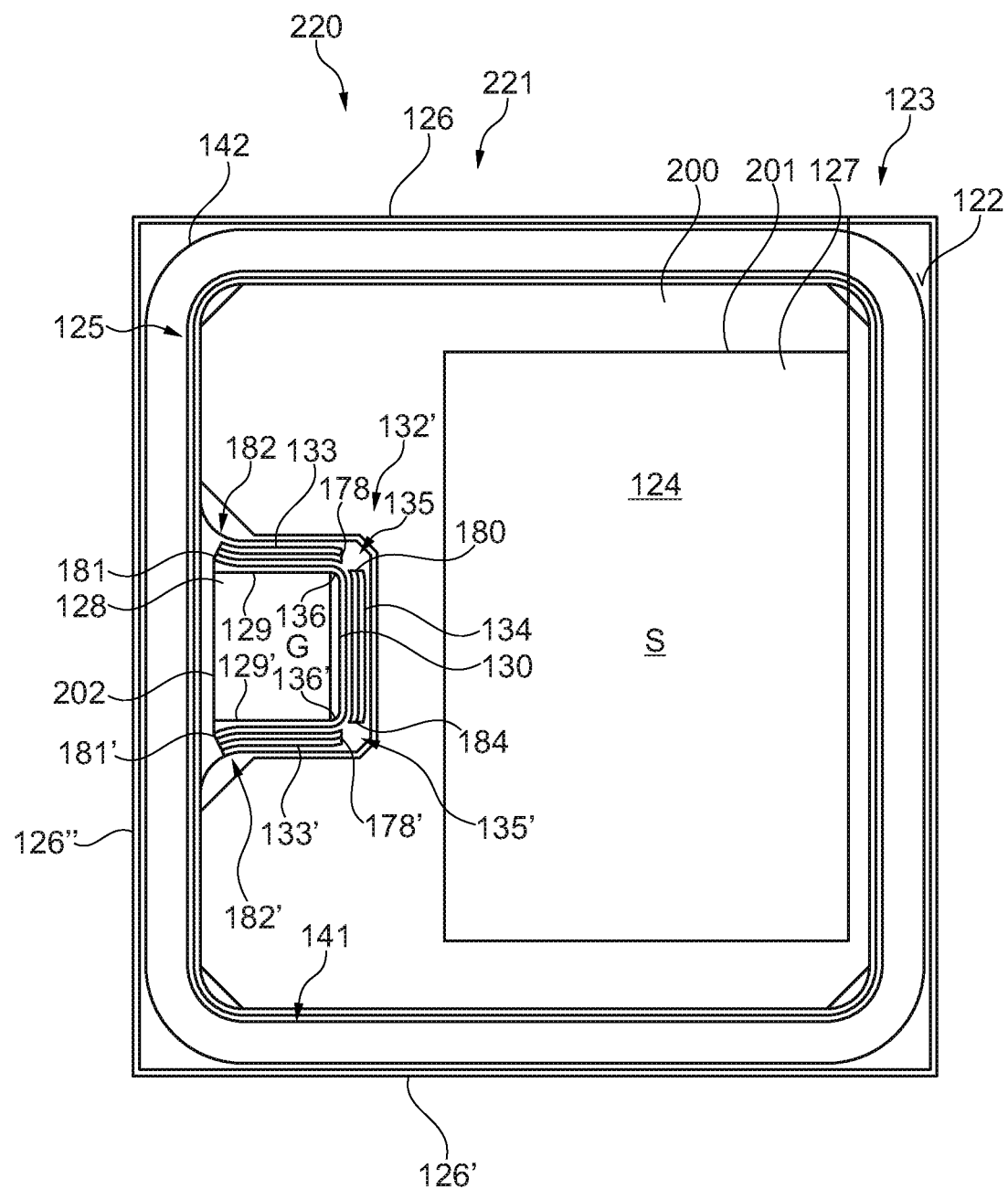
FIG. 10 illustrates a top view of a semiconductor die according to an embodiment.
Figure 11:
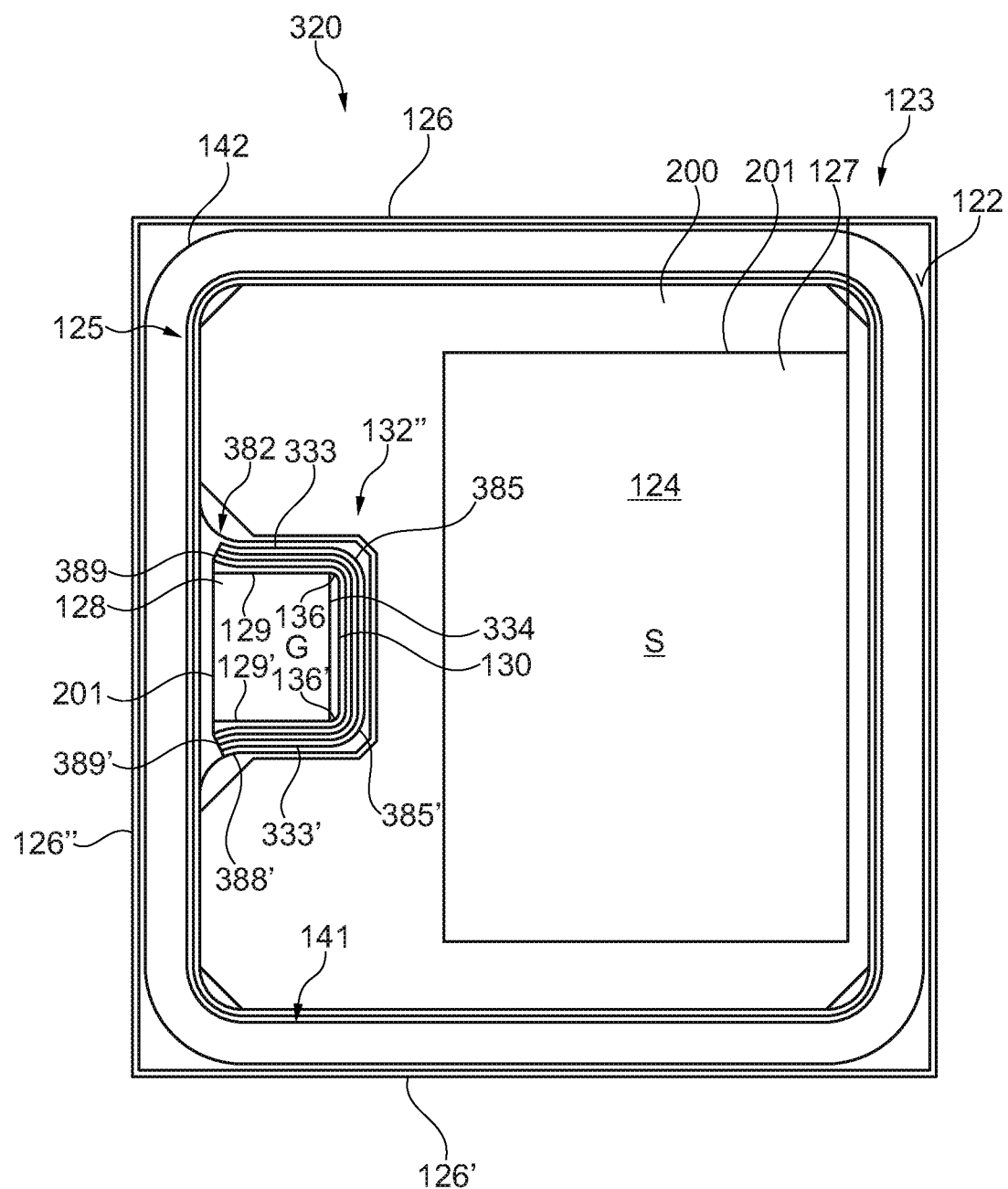
FIG. 11 illustrates a top view of a semiconductor die according to an embodiment.

FIGS. 9 to 11 illustrate top views of a semiconductor die with a superjunction transistor device that includes a chip layout which differs from the chip layout of the embodiments illustrated in FIGS. 1 to 8 in the position of the gate pad in relation to the sidewalls of the first surface of the semiconductor die.

In the embodiments illustrated in FIGS. 9 to 11, the semiconductor die 120 has a chip layout 121 in which the gate pad 128 is positioned on the first surface 122 intermediate two opposing sidewalls 126, 126'. The gate pad 128 may be positioned in approximately the centre of the distance between the two sidewalls 126, 126' and towards the periphery of a third sidewall 126" which extends between the opposing sidewalls 126, 126'. As in the embodiments illustrated in FIGS. 1 to 8, the gate pad 128 is positioned adjacent the cell field 124 of the superjunction transistor device 123 in the edge termination region 125. The cell field 124 and the source pad 127 may have a U-shape in plan view with the gate pad 128 positioned in the open part of the U such that three sides 129, 130, 129' of the gate pad 128 faced towards the cell field 124 and the source pad 127.

The semiconductor die 120 also includes a gate runner 141 which laterally surrounds the cell field 124 and the gate pad 128 and includes a drain ring 142 which laterally surrounds the gate runner 141. Both the gate runner 141 and the drain ring 142 may have a continuous ring-shaped form and are substantially concentric with the sidewalls of the upper surface 122 as in the embodiments illustrated in FIGS. 1 to 8. The three sides 129, 130, 129' of gate pad 128 are laterally surrounded by the cell field 124 due to the positioning of the gate pad 128 in approximately the centre of the distance between the opposing sidewalls 126, 126' and laterally inwards of the gate runner 141.

A passivation layer 200 is illustrated which is positioned on at least portions of the source pad 127 and the gate pad 128 and which has an opening 201 exposing a portion of the source pad 127 which divides a contact area for producing a contact to the source pad 127. Similarly, an opening 202 is provided exposing a portion of the gate pad 128 for producing a contact area to the gate pad 128. The passivation layer 200 may be formed of polyimide or any combination of an imide, a nitride, an oxide or an oxynitride, for example.

Each of FIGS. 9 to 11 illustrates a polysilicon ESD protection diode 132, 132', 132' having a differing lateral form that may be used in the chip layout 121.

The semiconductor die 120 also includes a polysilicon ESD protection diode 132 which is positioned between the gate pad 128 and the source pad 127. The polysilicon ESD protection diode 132 may also be considered to have a general U-shape in plan view. In the embodiment illustrated in FIG. 9, the polysilicon ESD protection diode 132 includes three separate sections 133, 134 and 133' which are positioned adjacent the three adjoining sides 129, 130, 129' of the gate pad 128. The first section 133 and the second section 134 extend substantially perpendicular to one another in the top view and are separated by a first gap 135 positioned at the first corner 136 of the gate pad 128 that is formed between the adjoining walls 129 and 130. The second section 134 is also substantially perpendicular to the third section 133' which is arranged adjacent the third side face 129' of the gate pad 128 such that a second gap 135' is formed at the second corner 136' of the gate pad 128 that is formed between the second side 130 and the third side 129' of the gate pad 128. The first and third sections 133, 133' extend substantially parallel to one another and are positioned adjacent opposing sides 129, 129' of the gate pad 128.

Each of the three sections 133, 134, 133' of the polysilicon ESD protection diode 132 has a substantially rectangular form in the top view with the long direction of the providing the width of diode. The structure of the separate three separate sections 133, 134, 133' of the polysilicon ESD protection diode 132 is the same as that described in connection with FIGS. 1, 2a-2b and 8.

The semiconductor die 120 also includes a shielding region, which is not illustrated in the top view of FIGS. 9 to 11. The shielding region comprises a non-depletable region and a laterally contiguous depletable region as in the embodiments described with reference to FIGS. 1 to 8. The shielding region surrounds the cell field 124 and has a structure and position relative to the source pad 127, gate pad 128 and polysilicon ESD protection diode 132 corresponding to that described with reference to FIGS. 1 to 8. In some embodiments, the gate polysilicon layer which electrically couples gate electrodes in the cell field 124 to the gate pad 128 also extends between the first and second sections 133, 134 of the polysilicon ESD protection diode 132 through the gap 135 and under the gate pad 128 and may also extend through the second gap 135' provided at the second corner 136' and between the second section 134 and the third section 133' and under the gate pad 128. An integrated gate resistor may also be provided under the gate pad 128 as in the embodiments described with reference to FIGS. 1 to 8.

FIG. 10 illustrates a top view of a semiconductor die 220 with a superjunction transistor device 123 and with a semiconductor chip layout 221 including the arrangement of the gate pad 128, source pad 127, cell field 124, edge termination region 125, gate runner 141, drain ring 142 and shielding region described with reference to the embodiment illustrated in FIG. 9. The semiconductor die 220 also includes a polysilicon ESD protection diode 132' including three laterally separated sections 133, 134, 133' which are positioned adjacent the three sides 129, 130, 129' as in the semiconductor die 220 in a general U-shape. The polysilicon ESD protection diode 132' differs from that illustrated in FIG. 9 in the lateral form of the first section 133 and third section 133'. The first section 133 includes a first end 178 which is positioned at the corner 136 and spaced apart from a first end 180 of the second section 134 by the gap 135. The opposing second end 181 of the first section 133 includes a curved extension 182 which has a convex form extending away from the gate pad 128. The curved extension 182 is substantially concentric with the curved outer contour of the source pad 127 at this position. Similarly, the third section 133' which is substantially parallel to the first section 133 and positioned adjacent the opposing side face 129' of the gate pad 128 includes a first end 178' which is positioned at the second corner 136' and spaced apart from a second end 184 of the second section 134 by the second gap 135' positioned at the second corner 136'. The third section 133' includes a second end 181' which includes a curved extension 182' which is convex with respect to the gate pad 128. The second section 134 is substantially rectangular in plan view. The first and second curved extensions 182, 182' extend away from the gate pad 128 in opposing directions and may be used to increase the width of the respective section 133, 133' and, therefore, the total width of the polysilicon ESD protection diode 132'.

The shielding region which underlies the polysilicon ESD protection diode 132' and surrounds the cell field 124 has a lateral form corresponding to the outer contour of the source pad 127 illustrated in the top view of FIG. 10. The curved extensions 182, 182' are, therefore, positioned vertically above curved portions of the shielding region and have a lateral from corresponding to the lateral form of the shielding region so that the polysilicon ESD protection diode 132' including the extensions 182, 182' are electrically shielded from the underlying drift region 51 and compensation region 52 (not shown in the top view of FIG. 10) by the intermediately positioned shielding region (not shown in the top view of FIG. 10).

The opposing sides 129, 129' of the gate pad 128 also include a curved portion that is concentric with the curved extensions 182, 182' such that the contour of the opposing sides 129, 129' of the gate pad 128 overlaps and is positioned vertically above the curved extensions 182, 182' of the polysilicon ESD protection diode 132'.

FIG. 11 illustrates the top view of a semiconductor die 320 with a superjunction transistor device 123 according to another embodiment with a polysilicon ESD protection diode 132" having a different lateral form. The polysilicon ESD protection diode 132" includes a single section and comprises a first concave portion 385 which extends around the first corner 136 into a first straight portion 333 which extends adjacent a first side 129 of the gate pad 128 into a convex portion 382 at a distal end 389. The ESD protection diode 132" extends in the opposing direction from the first corner 136 of the gate pad 128 into a second substantially straight portion 334 positioned adjacent the second side 130 of the gate pad 128, into a second concave portion 385' which extends around the second corner 136' of the gate pad 128 into a third substantially straight portion 333' positioned adjacent the third side 129' of the gate pad 128 which in turn extends into a second convex portion 388' at the second distal end 389'.

The use of the two convex extension portions 388, 388' enables the width of the polysilicon ESD protection diode 132" to be increased due to the more efficient occupation of the space available between the gate pad 128 and the source pad 127 and due to the use of the curved region formed between the gate pad 128 and the source pad 127 at the positions laterally adjacent the three side faces 129, 130, 129' of the gate pad 128 and the region formed between the side faces 129, 129' and the gate runner 141.

In the embodiments illustrated in FIGS. 9 to 11, the semiconductor die 120, 220, 320 includes a shielding region, which is not illustrated in the top view, which has a lateral form corresponding to the outer contour of the source pad 127. The shielding region also includes curved regions between transverse and longitudinal portions of the shielding region which are concentric with the curved portions of the outer contour of the source pad 127. The polysilicon ESD protection diode 132, 132', 132" can be electrically shielded from electrical potentials occurring in the drift region 51 and compensation region 52 due to the position of the polysilicon ESD protection diode 132, 132', 132" above the shielding region such that an inner portion of the polysilicon ESD protection diode 132, 132' is positioned above the non-depletable region of the shielding region and by forming the ESD protection diode such that it is aligned and conformal with the lateral form of the shielding region. The width of the polysilicon ESD protection diode 132' 132" can be increased in embodiments including the convex extensions compared to an arrangement including rectangular sections or rectangular distal ends whilst maintaining the electrical shielding of the polysilicon ESD protection diode 132', 132" from the drift region 51 and compensation region 52 by extending the polysilicon ESD protection diode 132', 132" over the convex portions of the shielding region.

In some embodiments, current crowding or high electrical fields within concave portions of the policy ESD protection diode are avoided by omitting concave portions at the one or more corners of the gate pad and splitting the ESD protection diode into two or three separate sections which are laterally spaced apart from one another which are electrically coupled in parallel between the source pad and the gate pad.

In order to avoid the formation of large electric fields and current crowding effects in the curved extensions, the radius R2 of the extensions may be selected to be sufficiently large, for example R2 may be around 155 µm. In embodiments including a single polysilicon ESD diode, such as the polysilicon ESD protection diode 32" illustrated in FIG. 8 or the polysilicon ESD protection diode 132" illustrated in FIG. 11, which have a concave radius positioned at the corner 36; 136; 136' of the gate pad 28; 128 the radius R2 of the extensions may be larger than R1, i.e. R2>R1 and in some embodiments, R2>4R1. As an example, the radius R1 of the concave portion, which is concave with respect to the gate pad 28; 128, may be around 33 µm and the radius R2 of the convex portions may be around 155 µm.

The lateral form of, and the relative positioning between, the contours of the polysilicon ESD protection diode, the curvature of the gate pad and the curvature of the source pad are selected so that they are conformal to the underlying shielding region. The polysilicon ESD protection diode is arranged on the shielding region such that it overlaps with the non-depletable region and has a lateral extent such that the depletable region extends further into the edge termination region than the polysilicon ESD protection diode. This arrangement provides electrical shielding of the polysilicon ESD protection diode by the shielding region against electrostatic and electric dynamic potentials in the drift region and compensation region below the gate pad of the semiconductor die.

In some embodiments, the semiconductor die includes an integrated non-depletable region 62, which extends further into the edge termination region 25 than the polysilicon ESD diode 32.

An integrated ESD protection diode is provided for a semiconductor die including a transistor device with a smaller active area, for example a superjunction transistor device that occupies a comparably small area, as the ESD protection diode is positioned between the gate pad and the cell field and has a lateral form which is conformal to the lateral shape of the cell field, the source pad and the shielding region.

In some embodiments, the polysilicon ESD protection diode includes convex extensions, extending away from the gate pad, that are conformal to the curvature of the shielding region in order to increase the width of the polysilicon ESD protection diode and the ESD HBM protection rating provided by the polysilicon ESD protection diode. In embodiments including two or more separate sections, the gap between neighbouring sections may be less than 10 µm, for example 2 µm or 1 µm. For example, the gap 36 between the two sections 33, 34' may be less than 10 µm, for example 2 µm or 1 µm. The width of the polysilicon ESD protection diode 32 may be extended by a corresponding amount by including the curved extensions, for example.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
   a transistor device comprising a cell field and an edge termination region surrounding the cell field;
   a source pad arranged on the cell field;
   a gate pad arranged laterally adjacent the cell field and in the edge termination region;
   a shielding region laterally surrounding the cell field, the shielding region comprising a non-depletable doped region; and
   a polysilicon ESD protection diode,
   wherein the polysilicon ESD protection diode is arranged laterally between the gate pad and the source pad and vertically above at least a portion of the shielding region,
   wherein the polysilicon ESD protection diode comprises at least two separate sections that are electrically coupled in parallel between the gate pad and the source pad, the at least two separate sections being laterally spaced apart by a gap situated at a corner of the gate pad,
   wherein the polysilicon ESD protection diode is vertically separated from the shielding region by an insulating layer.

2. The semiconductor die of claim 1, wherein the gate pad is arranged in a corner region of a first surface of the semiconductor die and has two adjoining sides surrounded by the cell field, and wherein the polysilicon ESD protection diode comprises two separate sections arranged adjacent the two adjoining sides of the gate pad such that the corner is arranged between the adjoining two sides.

3. The semiconductor die of claim 1, wherein at least one section of the polysilicon ESD protection diode comprises a first end facing towards the gap and a second end opposing the first end, and wherein the second end further comprises a convex extension that extends away from the gate pad.

4. The semiconductor die of claim 1, further comprising a polysilicon gate connection electrically coupling the gate pad to gate electrodes of the cell field, wherein the polysilicon gate connection extends from under the gate pad, through the gap and to the cell field.

5. The semiconductor die of claim 1, further comprising a gate resistor electrically coupled between the gate pad and a gate runner.

6. The semiconductor die of claim 5, wherein the gate resistor comprises first conductive via extending between a gate polysilicon layer and the gate pad and a second conductive via extending between the gate polysilicon layer and the gate runner.

7. The semiconductor die of claim 6, wherein the gate polysilicon layer comprises a gap positioned laterally between the first conductive via and the polysilicon ESD protection diode.

8. The semiconductor die of claim 1, wherein the polysilicon ESD diode comprises a plurality of doped polysilicon regions of opposing conductivity, wherein the regions of opposing conductivity are arranged alternately and laterally adjacent one another to form a plurality of vertical pn junctions, and wherein the pn junctions extend concentrically to the shielding region.

9. The semiconductor die of claim 1, wherein the corner of the gate pad faces the source pad.

10. The semiconductor die of claim 1, wherein the at least two separate sections of the polysilicon ESD protection diode are arranged at adjacent sides of the gate pad.

11. The semiconductor die of claim 1, wherein the shielding region is disposed in a semiconductor body, wherein the insulating layer is disposed on a first major surface of the semiconductor body, and wherein the polysilicon ESD protection diode is disposed on the insulating layer such that the polysilicon ESD protection diode is vertically separated from the semiconductor body by the insulating layer.

12. The semiconductor die of claim 1, wherein the polysilicon ESD protection diode has a lateral area which is smaller than a lateral area of the shielding region, such that the shielding region extends further into the edge termination region and into the cell field than the poly silicon ESD diode.

13. The semiconductor die of claim 1, further comprising:
   a drift region; and
   a compensation region for a superjunction device,
   wherein the shielding region is configured to provide electrical shielding of the polysilicon ESD protection diode against electrostatic and electricdynamic potentials in the drift region and the compensation region, below the gate pad.

* * * * *

UNITED STATES PATENT AND TRADEMARK OFFICE
CERTIFICATE OF CORRECTION

PATENT NO. : 11,430,781 B2
APPLICATION NO. : 16/750958
DATED : August 30, 2022
INVENTOR(S) : J. Weyers It is certified that error appears in the above-identified patent and that said Letters Patent is hereby corrected as shown below:

On the Title Page

Item (57)/Abstract, Line 7, please change "doped." to -- doped region. --

Signed and Sealed this
Eighteenth Day of October, 2022

Katherine Kelly Vidal
*Director of the United States Patent and Trademark Office*